United States Patent [19]
Cowan

[11] Patent Number: 5,204,909
[45] Date of Patent: Apr. 20, 1993

[54] AUDIO PROCESSING SYSTEM USING DELAYED AUDIO

[76] Inventor: John A. Cowan, 962 Harris Pkwy., Cartersville, Ga. 30120

[21] Appl. No.: 758,578

[22] Filed: Sep. 12, 1991

[51] Int. Cl.⁵ .............................................. H03G 7/00
[52] U.S. Cl. .................................... 381/106; 381/110; 333/14; 341/132; 328/173
[58] Field of Search ................... 381/110, 106; 333/14; 341/132; 328/173

[56] References Cited

U.S. PATENT DOCUMENTS

| | | | |
|---|---|---|---|
| 3,924,070 | 12/1975 | Seaver | 381/110 |
| 3,995,224 | 11/1976 | Sutphin, Jr. | 328/173 |
| 4,071,695 | 1/1978 | Flanagan et al. | 381/106 |
| 4,192,979 | 3/1980 | Jankowski, Jr. | 381/110 |
| 4,357,488 | 11/1982 | Knighton et al. | 381/110 |

*Primary Examiner*—Jin F. Ng
*Assistant Examiner*—Nina Tong

[57] ABSTRACT

An audio processing method is described wherein an audio input signal is delayed and then submitted for signal processing. The signal is sampled prior to the delay and control parameters for speech compression, voice gating, and voice activation of ancillary equipment generated. The delayed audio is then processed according to the parameters determined prior to the delay to eliminate poor transient response and signal clipping.

6 Claims, 4 Drawing Sheets

AUDIO PROCESSING SYSTEM USING DELAYED AUDIO

REFERENCES

| U.S. Pat. Documents | |
|---|---|
| 3,924,070 | Seaver |
| 3,936,610 | Schiffman |
| 4,489,442 | Anderson et al. |
| 4,550,426 | Gillig et al. |
| 4,140,876 | Gagnon et al. |
| 3,631,365 | Dolby |

BACKGROUND OF THE INVENTION

This disclosure relates to an improved audio signal processing system for use in audio amplification and recording systems, and in the voice controlled activation of radio transmitters, recording devices, and other ancillary equipment.

Since the early days of electronic audio amplification, methods have been devised to automatically control the gain of electronic amplifiers so that a wide range of input levels can be accommodated while maintaining a fixed output level. This technology is useful in Public Address applications to prevent speaker overload and excess amplification of the audio input, and in the recording industry to prevent overdriving the recording equipment. Over the years, various modifications of this technology have been introduced, all of which use some form of negative feedback to alter performance characteristics.

In addition to audio compression and level control, voice activation techniques have emerged whereby the presence of an audio signal is detected and a control signal generated so that ancillary equipment, such as recording devices or radio transmitters, can be activated.

As a variation of voice activation, the presence of an audio signal has been used to activate a switch in the audio signal path in a manner that interrupts the signal path when the audio input levels fall below a given threshold. This "Voice Gate" technology is frequently used to eliminate background noise and undesired breath sounds between words, and to mute unused inputs in a multiple channel audio circuit.

All of this technology suffers because the processes are applied in real time on the incoming audio signal. Since a finite time is required to analyze the signal and calculate the appropriate response parameters, transient control is inaccurate. In the case of speech compression, the initial amplification will be inappropriately high, distorting the output signal. Likewise, activation of the voice gate and ancillary voice operated equipment is delayed, so that the initial audio information is improperly processed or lost altogether.

SUMMARY OF THE NEW TECHNOLOGY

The many shortcomings of the prior art have been overcome by introducing a delay interval between the time the input signal is analyzed and the subsequent processing stages. The input audio signal is immediately analyzed by peak level detection circuitry and the calculation of the appropriate parameters begun. The input signal is then conveyed to an audio delay line, whose time delay interval is set to equal the response time of the feedback circuitry in the case of speech compression and the audio gate, or the turn on time of any ancillary equipment in the case of voice activation. When the delayed audio signal emerges from the delay line, the proper amplification parameters are in place, allowing the signal to be smoothly compressed without the transient distortion characteristic of the old technology. In a like manner, the voice gate and any voice activated accessories have time to fully activate prior to the arrival of the audio signal and therefore no loss of signal or front end clipping occurs.

Delay lines have been used in the prior art primarily to effect changes in the frequency spectrum or to create a reverberation effect. In addition, techniques for bandwidth compression have been implemented, wherein the signal is reduced in bandwidth for transmission or storage and then later re-expanded.

This new technology finds a unique and straightforward way to incorporate delay lines in conjunction with techniques used in the prior art to achieve a significant improvement in the art of audio processing.

It is possible to implement this new technology either with purely analog components or as a hybrid device using both analog and digital signal processing techniques. The audio delay is achieved by the use of either an analog delay line (so called "Bucket Brigades") or by the use of analog to digital conversion and digital memory storage.

DETAILED DESCRIPTION OF THE INVENTION

The important features that distinguish the practice of this new technology from what is old, can best be understood by observing the signal waveforms resultant from the practice of this technology in each of the several embodiments.

Figure 1:
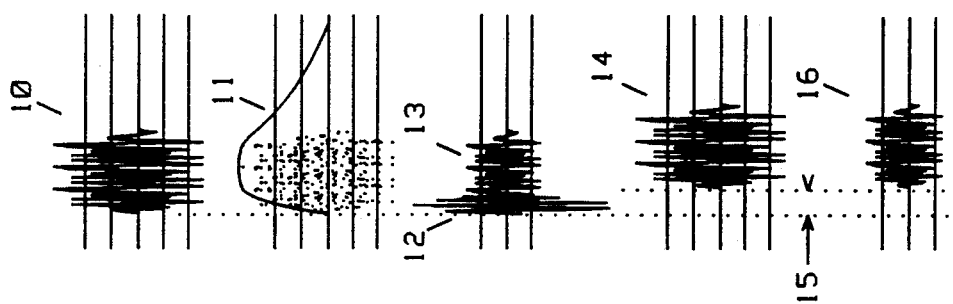
In FIG. 1, the important signal levels are shown which distinguish the delayed audio signal compression system.

In FIG. 1, the signal waveforms that distinguish the practice of this invention as used for signal compression is depicted. An audio signal 10 undergoes peak detection and a peak voltage level 11 is determined. Using the old technology, the application of this voltage in a feedback scheme results in the waveforms at 12 and 13. The detection delay would cause an undelayed audio signal to be initially processed with excess gain as seen at 12 and only later does the level control become appropriate 13. In the new technology, the input audio, delayed by time interval 15, is shown at 14. The improved control of the output level resulting from the application of feedback control to the delayed signal is shown at 16.

Figure 2:
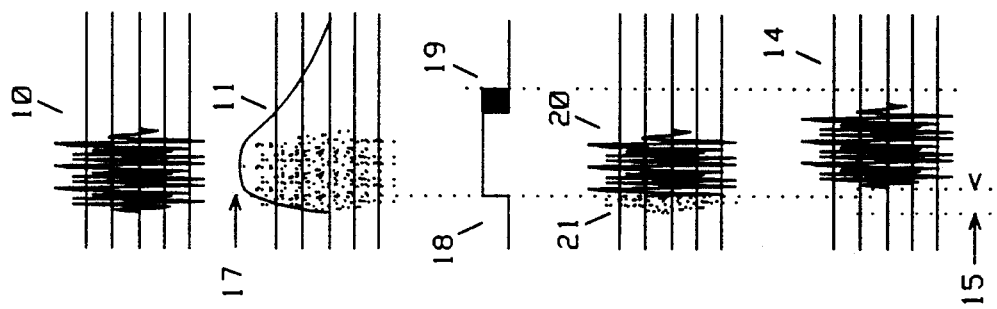
In FIG. 2, the important signal levels are shown which distinguish the delayed audio voice activation system.

In FIG. 2, the signal waveforms that distinguish the practice of this invention as used in voice activation applications is depicted. An audio signal 10 undergoes peak detection and a peak voltage level 11 is determined. When the peak voltage reaches the threshold point 17, the activation control line goes active 18. At 20 and 21, the undelayed audio output signal as seen in the old technology is depicted. Because of detection delays and the time needed for ancillary equipment to become operational, the front end of the signal 21 is lost. Using the new technology, when the audio is delayed by time 15, and used as the output 14, no loss of signal information occurs. In order to maintain the proper length of activation time, the activation signal must be extended by a time equal to the audio delay interval 19.

Figure 3:
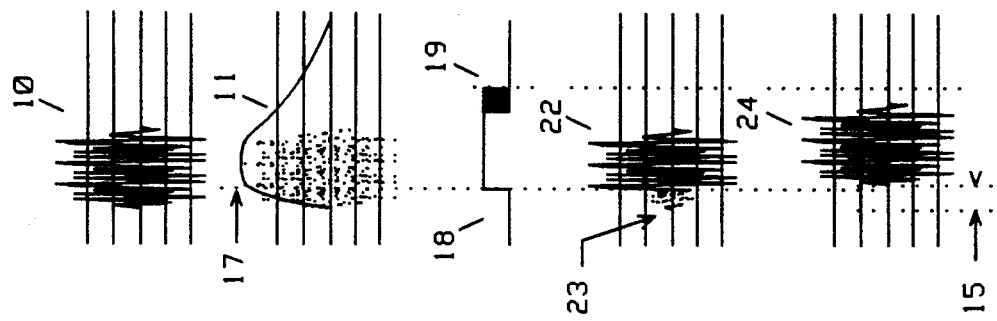
In FIG. 3, the important signal levels are shown which distinguish the delayed audio voice gate system.

In FIG. 3, the signal waveforms that distinguish the practice of this invention as used in a voice gated application is depicted. An audio signal 10 undergoes peak detection and a peak voltage level 11 is determined. When the peak voltage reaches the threshold point 17, the activation control line goes active 18. The audio gate immediately goes active allowing the audio to pass on to the output. At 22 and 23, the result of using undelayed audio is depicted. Due to detection delays, the front end of the audio signal is clipped 23. Using the new technology, the audio signal, delayed by time 15 and then gated, is cleanly passed 24. In order to maintain the proper length of gate activation, the activation signal must be extended by a time equal to the audio delay seen at 19.

In FIGS. 4 through 7, block diagrams showing the electronic and mathematical functions necessary for the practice of this improved technology are depicted. It is obvious and anticipated in this declaration that the method of this technology can be implemented using either analog or digital signal processing techniques.

Figure 4:
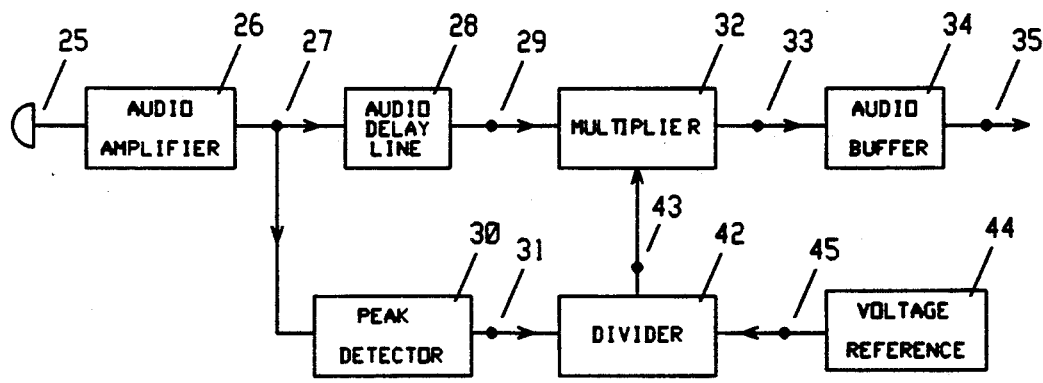
In FIG. 4, a block diagram of the necessary components to implement delayed audio signal compression is shown.

In FIG. 4, a block diagram showing the functional implementation of a delayed audio signal compression device is shown. This embodiment of the invention can be easily constructed using digital or analog components.

An audio signal emanating from a microphone or other audio signal source 25 is applied to an audio amplifier 26 whereby the signal level is brought up to a satisfactory level. This amplified signal is delivered by terminal to 27 an audio delay line 28 and a peak voltage detector 30. The peak detector determines the maximum voltage level present in the audio signal and has its time constant set so its output quickly rises to the maximum level and slowly decays to baseline. The resultant peak level control signal at terminal 31 is delivered to a divider module 42. A voltage reference source 44 is set to the maximum desired fixed output level and this control voltage is also delivered to the divider 42 by signal line 45. The division of the reference voltage by the peak voltage yields an amplification coefficient which is delivered by signal line 43 to a multiplier module 32. The gain of the multiplier 32 is thereby controlled, so that if a signal equal to the peak level arrives at the multiplier input, the output level at terminal 33 will equal the reference output. If the instantaneous input signal level is less than the peak value, the output at 33 will be proportionally less. Thus, the peak audio output of the multiplier will be limited to the level of the reference voltage over a wide range of input conditions.

The actual input 29 to the multiplier is derived from the analog delay line 28, whose delay interval is set to equal the sum of the response time of the peak detector and all arithmetic components. In this manner, the audio signal arriving at the multiplier input is identical to the original audio input only displaced in time by an amount equal to the delay interval. Therefore, transient gain distortion is eliminated because the proper multiplier gain coefficient is in place prior to the actual arrival of the signal. The level stabilized output of the multiplier at 33 is buffered by 34 and conveyed to the output at terminal 35.

Figure 5:
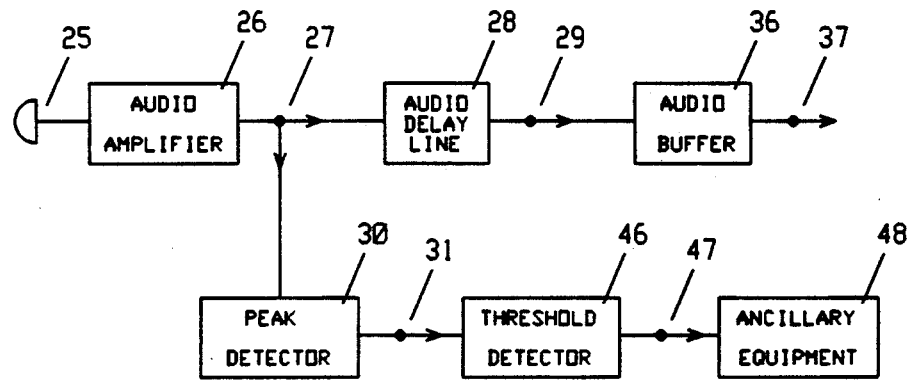
In FIG. 5, a block diagram of the necessary components to implement delayed audio voice activation is shown.

In FIG. 5, a block diagram showing the functional implementation of a delayed audio voice activation device is shown. This embodiment of the invention can be easily constructed using a digital or analog approach.

An audio signal emanating from a microphone or other audio signal source 25 is applied to an audio amplifier 26 whereby the input signal is brought up to a satisfactory level. This amplified signal at terminal 27 is delivered to an audio delay line 28 and a peak voltage detector 30. The peak detector determines the maximum voltage level present in the audio signal and has its time constant set so its output quickly rises to the maximum level and slowly decays to baseline. The resultant peak level control signal at terminal 31 is delivered to a threshold detector 46, which functions to trigger an output control signal 47 when an input signal of sufficient level is present. The control output 47 is available to operate ancillary equipment 48.

The amplified audio signal at terminal 27 is also presented to the delay line 28 and delayed by a time interval sufficient to allow detection of the input signal and to allow the ancillary controlled equipment time to fully activate. The audio output of the delay line at terminal 29 is delivered to an audio output buffer 36 and made available as output 37. The threshold detector 46 is set to hold the "on" condition for a time interval beyond further input so the audio delay line will have time to clear stored signals before allowing the ancillary equipment to turn off.

Figure 6:
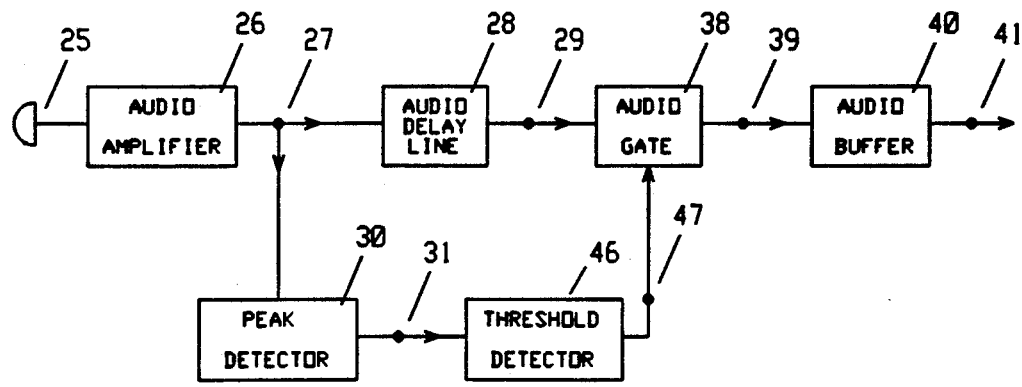
In FIG. 6, a block diagram of the necessary components to implement the delayed audio voice gate function is shown.

In FIG. 6, a block diagram showing the functional implementation of a delayed audio voice gate device is shown. This embodiment of the invention can be easily constructed using a digital or analog approach. An audio signal emanating from a microphone or other audio signal source 25 is applied to an audio amplifier 26 whereby the signal is brought up to a satisfactory level. This amplified signal at terminal 27 is delivered to an audio delay line 28 and a peak voltage detector 30. The peak detector determines the maximum voltage level present in the audio signal and has its time constant set so its output quickly rises to the maximum level and slowly decays to baseline. The resultant peak level control signal at terminal 31 is delivered to a threshold detector 46, which functions to trigger an output control signal 47 when an input signal of sufficient level is present.

The amplified input signal at terminal 27 is also presented to the delay line 28 and delayed by a time interval sufficient to compensate for the detection delay of the threshold detector. The output of the delay line at terminal 29 is delivered to the audio gate 38 which serves to interrupt the signal path under the control of the threshold detector's output via terminal 47. The threshold detector 46 is set to hold the "on" condition for a time interval beyond further audio input so the audio delay line will have time to clear before the gate closes. The gate function is such that when the control signal is low, no audio signals can pass. When the control signal is active, audio passes to the output unimpeded. Since the gate control signal is derived from the audio input prior to the delay, the gate has time to become fully operational before the input audio actually arrives for processing. The audio output of the gate at terminal 39 is delivered to an audio output buffer 40 and made available as output 41.

Figure 7:
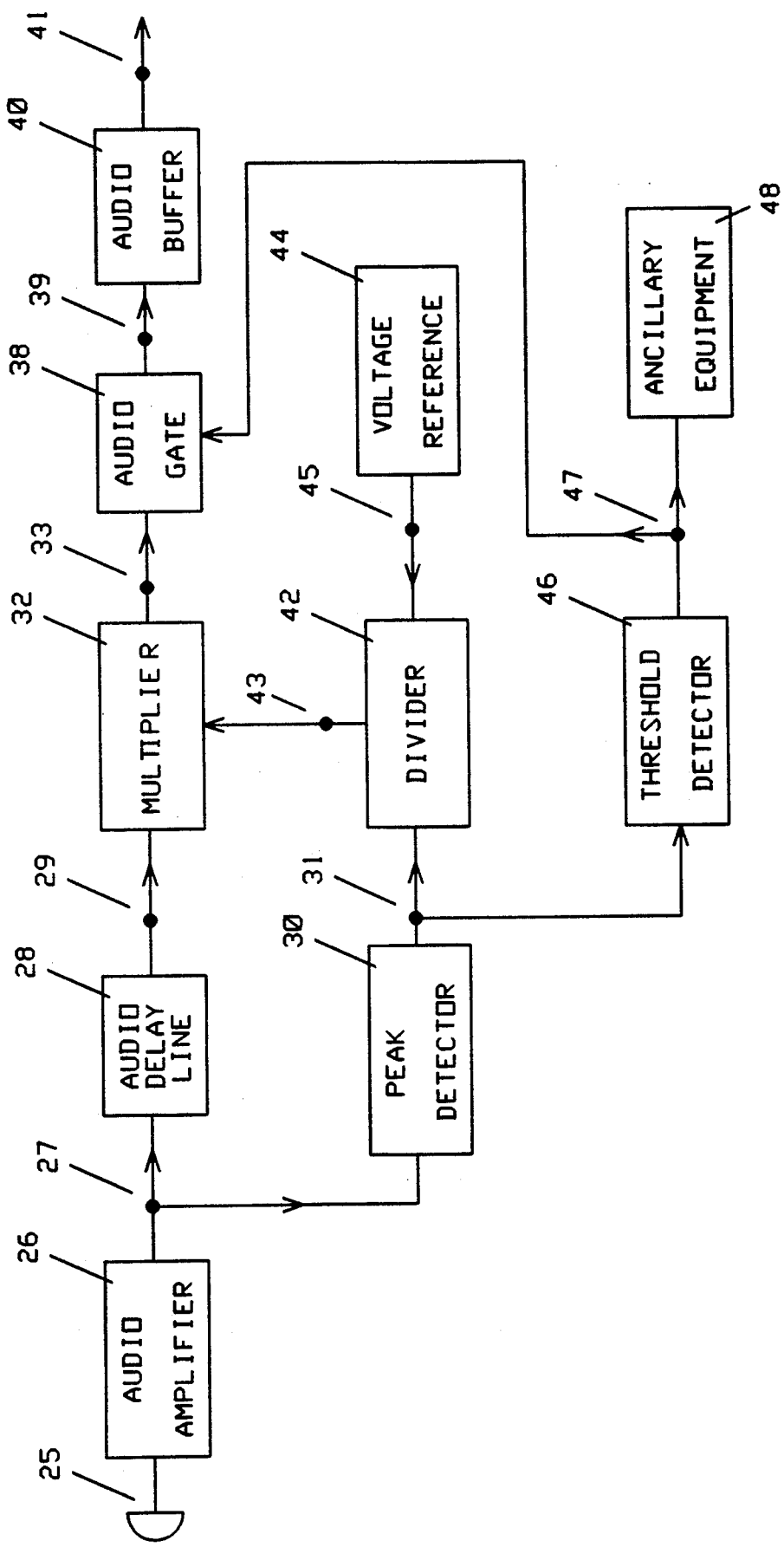
In FIG. 7, a block diagram of the necessary components to implement the delayed audio signal compression, voice gate, and voice activation processes in combination is shown.

In FIG. 7, a block diagram showing the functional implementation of a delayed audio signal processing device that includes all the embodiments of this invention is shown. This embodiment of the invention can be easily constructed using a digital or analog approach and incorporates delayed audio speech compression, voice activation, and voice gating.

An audio signal emanating from a microphone or other audio signal source 25 is applied to an audio amplifier 26 whereby the signal is brought up to a satisfactory level. This amplified signal is delivered by terminal 27 to an audio delay line 28 and a peak voltage detector 30. The peak detector determines the maximum voltage level present in the audio signal and has its time constant set so its output quickly rises to the maximum level and slowly decays to baseline. The resultant peak level control signal at terminal 31 is delivered to the threshold detector 46 and a divider module 42. A voltage reference source 44 is set to the maximum desired output level and this control voltage is delivered to the divider 42 by signal line 45. The division of the reference voltage by the peak voltage yields an amplification coefficient which is delivered by signal line 43 to a multiplier module 32. The gain of the multiplier 32 is thereby controlled, so that if a signal equal to the peak level arrives at the multiplier input, the peak output level at terminal 33 will equal the reference output. If the instantaneous input signal level is less than the peak value, the output at 33 will be proportionally less. Thus the peak audio output the multiplier will be limited to the level of the reference voltage over a wide range of input conditions. The input to the multiplier 32 from terminal 29 is derived from the analog delay line 28, whose delay interval is set to equal the sum of the response time of the peak detector and all arithmetic components, and the turn on time of any ancillary equipment. In this manner, the audio signal arriving at the multiplier input is identical to the original audio input, only displaced in time by an amount equal to the delay interval. Therefore, no transient gain shifts occur because the proper amplifier gain parameters are in place prior to the arrival of the signal.

The output of the peak detector 30 is also delivered by signal line 31 to a threshold detector 46, which functions to trigger an output control signal 47 when an input signal of sufficient level is detected. This output is made available to control ancillary equipment 48 and also as a control signal for the audio gate 38.

The compressed output of the multiplier at terminal 33 is delivered to the audio gate 38 which serves to interrupt the signal path under the control of the threshold detector's output via terminal 47. The gate function is such that when the control signal is low, no audio signals can pass. When the control signal is active audio passes to the output unimpeded. Since the gate control signal is derived from the audio input prior to the delay, the gate has time to become fully operational before the input audio actually arrives for processing. The threshold detector 46 is set to hold the "on" condition for a time interval beyond further input so the audio delay line will have time to clear before closing the gate and so that the ancillary equipment will be held on until all audio has been processed. The output of the audio gate at terminal 39 is delivered to an output buffer 40 and made available as output 41.

Figure 8:
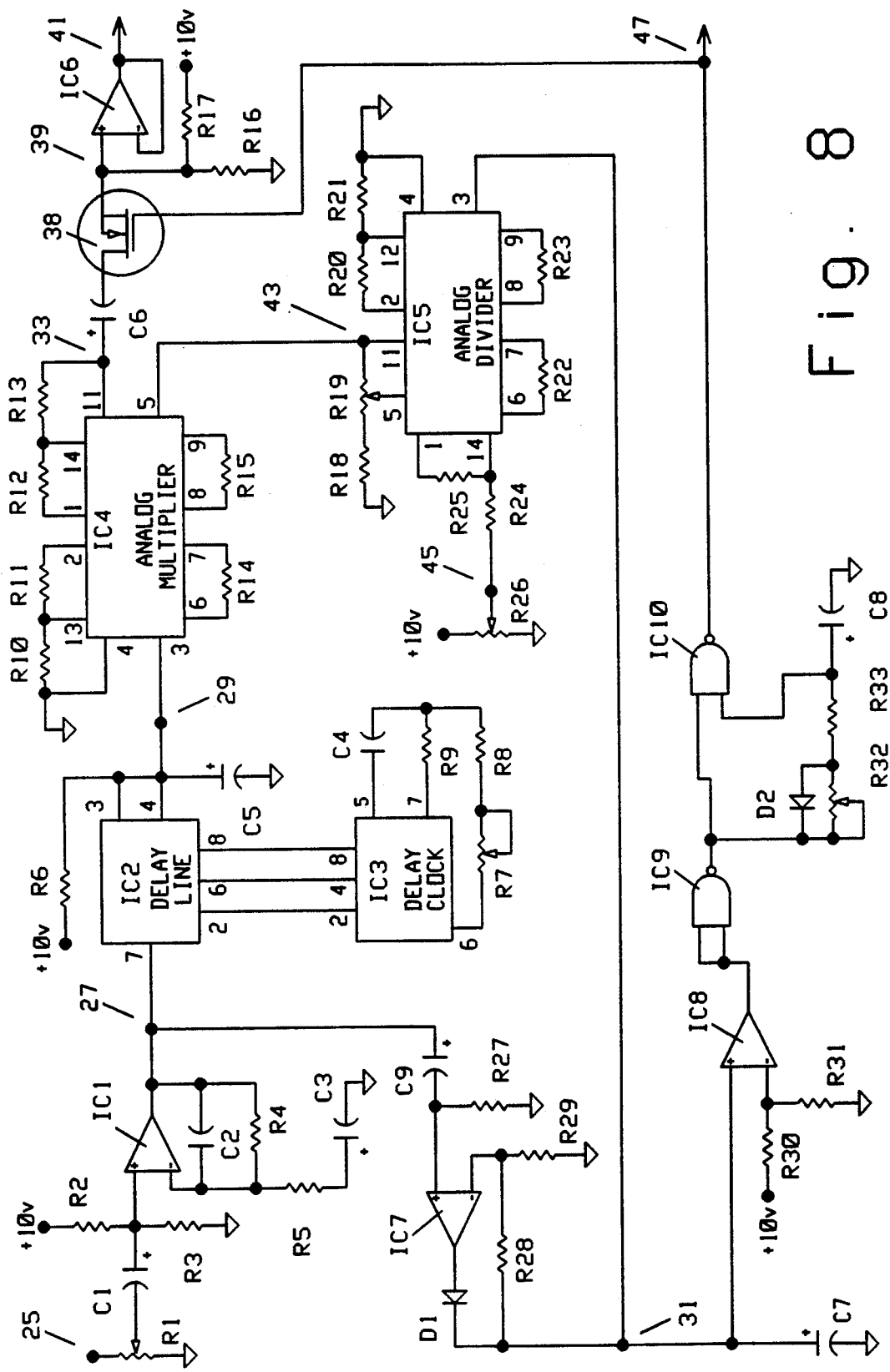
In FIG. 8, a circuit diagram illustrating one of the many anticipated methods of implementing the delayed audio signal compression, voice gate, and voice activation process is shown.

In FIG. 8, a circuit diagram is depicted which illustrates one of the many anticipated methods to implement this new technology. Wherever possible, numerical references on this figure correlate to functional blocks and signal paths illustrated on FIG. 7.

The input audio signal from a microphone or other input source is applied to terminal 25. R1, R2, R3, R4, R5, C1, C2, C3, and IC1 form an audio amplifier correlating with block 26 on FIG. 7. The amplifier gain is adjustable by R1. This amplified signal at 27 is conveyed to a peak detector formed by C9, R27, R28, R29, D1, C7, and IC7. This correlates with block 30 on FIG. 7. The time constant characteristics of the peak detector are established by C7, R28, and R29. The output of the peak detector at terminal 31 is conveyed to a threshold detector-extender element and an analog divider. The threshold detector-extender is formed by R30, R31, R32, R33, D2, C8, IC8, IC9, and IC10. This correlates with block 46 on FIG. 7. The threshold level is set by the voltage divider formed by R30 and R31. The time extension interval is set by R32 to equal the audio delay line interval. The output of this element at terminal 47 is made available as an output to control ancillary equipment and also to control the audio gate 38. The output of the peak detector at terminal 31 is also conveyed as an input to the divider. The divider is composed of R18, R19, R20, R21, R22, R23, R24, R25, and IC5 which in this case is an XR-2208 integrated circuit. This correlates with block 42 on FIG. 7. This divider also takes as an input, a reference voltage level generated and adjusted by R26 and a 10 volt power source. This correlates with block 44 on FIG. 7. The output of this reference is conveyed to the divider input by signal path 45. The output of the division is conveyed by signal path 43 to one input of a multiplier stage. The multiplier is formed by R10, R11, R12, R13, R14, R15, and IC4 which is an XR-2208 integrated circuit. This correlates with block 32 on FIG. 7.

The amplified audio input at terminal 27 is also conveyed to an audio delay line. This delay line is formed by R6, R7, R8, R9, C4, C5, IC2, and IC3. IC2 is a MN3008 bucket brigade integrated circuit and IC3 is a MN 3101 clock driver integrated circuit. R7, R8, and C4 determine the clock frequency and therefore the delay interval of the delay line and C5 serves to filter out unwanted high frequency sampling noise. This correlates with block 28 on FIG. 7. The output of the delay line is conveyed by signal path 29 to become the second input to the multiplier.

The output of the multiplier stage is conveyed by signal path 33 to a field effect transistor 38 which serves as an audio gate under the control of the threshold detector-extender via signal path 47. Since the block function is produced by a single component, the transistor carries the same number as the block on FIG. 7. The output of the transistor switch is conveyed via signal path 39 to an output buffer formed by R16, R17, and IC6. This correlates with block 40 on FIG. 7. The buffered audio output is available to ancillary equipment via signal path 41.

I claim as my invention:

1. A method of limiting the peak audio signal level from a signal source of varying levels to a fixed value, using delayed audio to improve transient response, comprising the following steps of:

amplifying the input signal to a suitable level.

sampling the amplified input signal by means of an analog or digital peak level detector wherein the output of said detector rapidly rises to the level of the amplified input signal and slowly decreases as the input level falls, generating a reference level for signal comparison, dividing the output of the peak level detector into the reference level by means of an analog or digital divider and thereby calculate a multiplication coefficient suitable for achieving compression of the amplified input signal, delaying the amplified input signal after the sampling stage by means of an analog or digital delay line for a time interval equal to the cumulative delay introduced by the sampling stage, the divider, and the subsequent multiplier, multiplying the delayed audio signal by the multiplication coefficient by means of an analog or digital multiplier in a manner so that the peak output of the multiplier will be equal to or less than the reference level, buffering the output of the multiplier for use by tape recorders, radio transmitters, public address amplifiers or any other equipment requiring an audio input signal.

2. An improved method of detecting the presence of audio signals from a signal source and using the presence of the audio signals from said source to activate tape recorders, radio transmitters, or other ancillary equipment requiring an audio input signal, that uses a delayed audio signal so that said equipment becomes completely operational before the arrival of the audio signal, comprising the following steps:

amplifying the input audio signal to a suitable level, generating a reference value, sampling the amplified input signal by means of an analog or digital peak level detector wherein the output of said detector rapidly rises to the level of the amplified input signal and slowly decreases as the input level falls, comparing the output of the peak level detector to the reference value by means of an analog or digital threshold detector so that a control signal is generated that immediately activates the ancillary equipment whenever signals above the reference level are present in the amplified input signal, using an analog or digital delay line to delay the amplified audio signal after the sampling stage, by a time equal to the sum of the time required for threshold detection and the turn on time of the ancillary equipment, extending the control signal from the threshold detector after cessation of audio input by a time equal to the time delay of the audio delay line and making this control signal available so that the ancillary equipment will continue operation until all audio signals have cleared the delay line, buffering the audio output of the delay line for use as the audio input of the ancillary equipment.

3. A method of generating a voice gate in an audio channel whereby the output of the channel is muted when no audio is present and switched to full amplification when input audio above a given threshold is detected, using delayed audio so that the gate becomes fully operational before being presented with the audio signal, comprising the following steps of:

amplifying the input signal to a suitable level, generating a reference level, sampling the amplified input signal by means of an analog or digital peak level detector wherein the output of said detector rapidly rises to the level of the amplified input signal and slowly decreases as the input level falls, comparing the output of the peak level detector to the reference level by means of an analog or digital threshold detector so that a control signal is generated whenever signals above the reference level are present in the amplified input signal, using an analog or digital delay line to delay the amplified audio signal after the sampling stage, by a time equal to the time required for threshold detection, extending the control signal from the threshold detector after cessation of audio input by a time equal to the time delay of the audio delay line so that the control signal is held active until all audio signals have cleared the delay line and making this signal available for the control of an audio gate, inserting an analog or digital audio gate in the audio signal path after the delay line, controlled by the extended output of the threshold detector in such a manner that the audio path is interrupted when the threshold detector is inactive, buffering the audio output of the audio gate for subsequent use by public address amplifiers or any other equipment requiring a voice gated audio input.

4. A method of limiting the peak audio signal level from a signal source of varying levels, and using the presence of said audio signal to activate tape recorders, radio transmitters, public address amplifiers, or any ancillary equipment requiring an audio input signal, and further using the level of said audio signal to abruptly mute the audio channel when the input level falls below a predetermined threshold, using delayed audio to improve transient response and eliminate signal loss comprising the following steps of:

amplifying the input signal to a suitable level, generating a reference level, sampling the amplified input signal by means of an analog or digital peak level detector wherein the output of said detector rapidly rises to the level of the amplified input signal and slowly decreases as the input level falls, dividing the output of the peak level detector into the reference level voltage by means of an analog or digital divider to calculate a multiplication coefficient satisfactory for compression of the input signal, using an analog or digital delay line to delay the amplified audio signal after the sampling stage, by a time equal to the cumulative delay of all arithmetic steps, and the turn on time of any ancillary equipment, multiplying the delayed audio signal by the multiplication coefficient by means of an analog or digital multiplier in a manner so that the peak output of the multiplier will be equal to or less than the reference level, comparing the output of the peak level detector to the reference level by means of an analog or digital threshold detector so that a control signal is generated whenever signals above the reference level are present in the amplified input signal and extending the activation time by an additional time interval equal to the audio delay interval so that this control signal is held on until all signals have cleared the delay line, making this extended control signal available for the control of ancillary equipment and the audio gate, inserting an analog or digital audio gate in the audio signal path after the delay line, controlled by the extended output of the threshold detector in such a manner that the audio path is interrupted when the threshold detector is inactive, buffering the audio output of the audio gate for subsequent use by ancillary equipment.

5. A circuit for limiting the peak audio signal level from an audio signal source of varying levels, and using the presence of said audio signal to activate tape recorders, radio transmitters, public address amplifiers, or any ancillary equipment requiring an audio input signal, and further using the level of said audio signal to abruptly mute the audio channel when the input level falls below a predetermined threshold, using delayed audio to improve transient response and prevent signal loss, the circuit comprising:

an audio amplifier stage,
a peak voltage level detector,
a variable voltage reference source,
a voltage threshold detector having the means to compare the peak voltage to the reference and generate a control signal,
a pulse extender having the means to lengthen the control signal by a variable amount so that this control signal is held on until all signals have cleared the delay line, the thusly lengthened signal being additionally available to operate external equipment,
an analog divider whereby the voltage reference is divided by the peak voltage and an output signal made available,
an analog delay line and associated clocking circuitry for the delay of the input audio signal, said delay interval being adjustable,
an analog multiplier operating on the delayed audio signal and the output of the divider, acting as a variable gain stage for the purpose of audio compression,
an audio gate having the means to interrupt the audio signal path between the multiplier and the output, being controlled by the extended control signal,
an output buffer stage.

6. A circuit according to claim 5, where the audio gate is a field effect transistor.

* * * * *